United States Patent
Root et al.

(10) Patent No.: US 7,271,607 B1
(45) Date of Patent: *Sep. 18, 2007

(54) ELECTRICAL, HIGH TEMPERATURE TEST PROBE WITH CONDUCTIVE DRIVEN GUARD

(75) Inventors: Bryan J. Root, Apple Valley, MN (US); William A. Funk, Eagan, MN (US)

(73) Assignee: Celadon Systems, Inc., Burnsville, MN (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/242,610

(22) Filed: Oct. 3, 2005

Related U.S. Application Data

(63) Continuation of application No. 10/809,051, filed on Mar. 25, 2004, now Pat. No. 6,975,128.

(60) Provisional application No. 60/458,467, filed on Mar. 28, 2003.

(51) Int. Cl.
*G01R 31/02* (2006.01)

(52) U.S. Cl. .................................. 324/761; 324/754

(58) Field of Classification Search .................. None
See application file for complete search history.

(56) References Cited

U.S. PATENT DOCUMENTS

| | | |
|---|---|---|
| 3,787,768 A | 1/1974 | Kubota et al. |
| 3,963,986 A | 6/1976 | Morton et al. |
| 4,365,109 A | 12/1982 | O'Loughlin |
| 4,480,223 A | 10/1984 | Aigo |
| 4,667,523 A | 5/1987 | Becker et al. |
| 4,731,577 A | 3/1988 | Logan |
| 4,845,426 A | 7/1989 | Nolan et al. |
| 5,003,254 A | 3/1991 | Hunt et al. |
| 5,015,947 A | 5/1991 | Chism |
| 5,150,040 A | 9/1992 | Byrnes et al. |
| 5,151,653 A | 9/1992 | Yutori et al. |
| 5,168,218 A | 12/1992 | Rich |
| 5,192,907 A | 3/1993 | Bonaria |
| 5,196,789 A | 3/1993 | Golden et al. |
| 5,325,052 A | 6/1994 | Yamashita |
| 5,397,996 A * | 3/1995 | Keezer ...................... 324/754 |
| 5,473,254 A | 12/1995 | Asar |
| 5,486,770 A | 1/1996 | Johnson |
| 5,488,292 A | 1/1996 | Tsuta |
| 5,525,911 A | 6/1996 | Marumo et al. |
| 5,729,150 A | 3/1998 | Schwindt |

(Continued)

FOREIGN PATENT DOCUMENTS

EP 0 177 809 4/1986

(Continued)

*Primary Examiner*—Jermele Hollington
(74) *Attorney, Agent, or Firm*—Dorsey & Whitney LLP

(57) ABSTRACT

A probe needle apparatus and method provides a drive guard having the same potential as a probe needle for reducing signal noise in low current measurements. The probe needle apparatus includes a conductive central core covered with alternating layers of dielectric and conductive materials, a first layer of dielectric material applied to maintain electrical access to the conductive central core while providing continuous isolation of the conductive central core elsewhere, and a conductive driven guard layer applied around the first layer of dielectric material in electrical isolation from the conductive central core.

4 Claims, 6 Drawing Sheets

U.S. PATENT DOCUMENTS

| | | |
|---|---|---|
| 5,742,174 A | 4/1998 | Kister et al. |
| 5,952,843 A | 9/1999 | Vinh |
| 6,014,032 A | 1/2000 | Maddix et al. |
| 6,050,829 A | 4/2000 | Edridge et al. |
| 6,075,376 A | 6/2000 | Schwindt |
| 6,124,723 A | 9/2000 | Costello |
| 6,137,302 A | 10/2000 | Schwindt |
| 6,201,402 B1 | 3/2001 | Root |
| 6,275,051 B1 | 4/2001 | Bachelder et al. |
| 6,232,143 B1 | 5/2001 | Maddix et al. |
| 6,276,956 B1 | 8/2001 | Cook |
| 6,586,954 B2 | 7/2003 | Root |
| 6,603,322 B1 | 8/2003 | Boll et al. |
| 6,847,219 B1 | 1/2005 | Lesher et al. |
| 6,963,207 B2 * | 11/2005 | Root et al. .......... 324/754 |
| 6,975,128 B1 * | 12/2005 | Root et al. .......... 324/761 |
| 2001/0011902 A1 * | 8/2001 | Schwindt .......... 324/762 |

FOREIGN PATENT DOCUMENTS

| | | |
|---|---|---|
| JP | 06088906 A * | 3/1994 |
| WO | WO99/04273 | 1/1999 |

* cited by examiner

ELECTRICAL, HIGH TEMPERATURE TEST PROBE WITH CONDUCTIVE DRIVEN GUARD

CROSS REFERENCE TO RELATED APPLICATION(S)

This patent application is a continuation of U.S. patent application Ser. No. 10/809,051, filed Mar. 25, 2004, now U.S. Pat. No. 6,975,128, issued on Dec. 13, 2005, which claims benefit of U.S. Provisional Patent Application Ser. No. 60/458,467, filed Mar. 28, 2003, the contents of which are incorporated herein in its entirety by reference.

FIELD OF THE INVENTION

The present invention relates generally to semiconductor test equipment, and more particularly, to a probe apparatus used in semiconductor test equipment for electrically probing devices on a semiconductor wafer.

BACKGROUND OF THE INVENTION

The semiconductor industry has a need to access many electronic devices on a semiconductor wafer. As the semiconductor industry grows and devices become more complex, many electrical devices, most commonly semiconductor devices, must be electrically tested, for example, for leakage currents and extremely low operating currents. These currents are often below 100 fA. In addition, the currents and device characteristics are often required to be evaluated over a wide temperature range to understand how temperature affects a device. Also, because of materials characteristics of dielectrics, it is often difficult to test characteristics of semiconductor devices in a wide operating temperature range.

To effectively measure at currents below 100 fA (Femto Ampere), a measurement signal must be isolated from external electrical interference, leakage currents through the dielectric material, parasitic capacitance, triboelectric noise, piezoelectric noise, and dielectric absorption, etc.

Accordingly, there is a need for improved semiconductor test equipment for electrically probing semiconductor devices at low currents over a wide temperature range.

SUMMARY OF THE INVENTION

To solve the above and the other problems, the present invention provides a probe needle apparatus and method including a driven guard having the same potential as a probe needle for reducing signal noise in low current measurements. The probe needle apparatus includes a central conductive probe needle covered with alternating layers of dielectric and conductive materials.

In one embodiment, the probe needle apparatus comprises a central conductive probe needle surrounded by a high temperature dielectric layer of material. A conductive layer is deposited around the dielectric layer to provide a driven guard. The initial layer of dielectric material provides a thin and continuous barrier to prevent the conductive driven guard from contacting electrically to the probe needle. In one embodiment, a subsequent protective layer is applied over the driven guard.

In one embodiment of the present invention, the probe needle can be a probe needle disclosed in U.S. Provisional Patent Application Ser. No. 60/392,394, filed Jun. 28, 2002, entitled "SHIELDED PROBE APPARATUS FOR PROBING SEMICONDUCTOR WAFER". Also, in one embodiment, the probe needle is masked at the distal and proximate ends to allow continuity. The masked probe needle is then coated with a flexible high temperature dielectric, prior to being coated with a conductive layer, such as gold, for the driven guard. An optional top layer can be applied by a method, such as dipping and spinning, or depositing by other means to protect the outer conductive layer.

In one embodiment of the probe needle, an initial dielectric layer is applied by dipping and spinning. After thermally curing the dielectric layer, the conductive layer for the driven guard is applied.

Additionally in one embodiment of the present invention, the probe needle may be coated with an initial dielectric layer of SiO2. A thin conductive layer of the driven guard may be strengthened by over-plating.

These and other features of the present invention will become apparent to those skilled in the art from the following detailed description, wherein it is shown and described illustrative embodiments of the invention, including best modes contemplated for carrying out the invention. As it will be realized, the invention is capable of modifications in various obvious aspects, all without departing from the spirit and scope of the present invention. Accordingly, the drawings and detailed description are to be regarded as illustrative in nature and not restrictive.

DETAILED DESCRIPTION OF THE PREFERRED EMBODIMENTS

Figure 1:
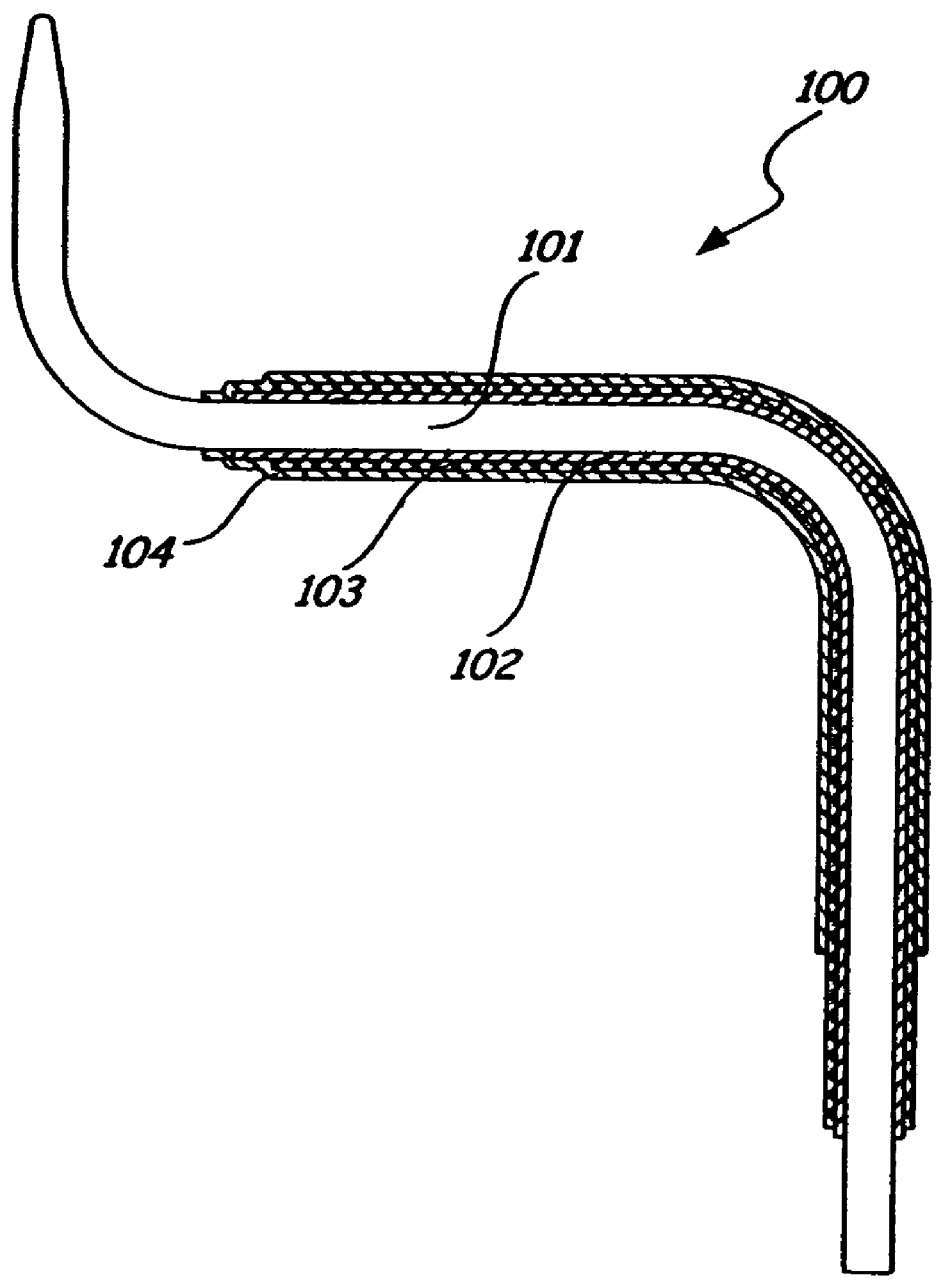
FIG. 1 is a cross sectional view of one embodiment of a shielded probe apparatus in accordance with the principles of the present invention.

In the following description of a preferred embodiment, reference is made to the accompanying drawings, which form a part hereof, and in which is shown by way of illustration a specific embodiment in which the invention may be practiced. It is to be understood that other embodiments may be utilized and structural changes may be made without departing from the scope of the present invention.

For purposes of explanation, numerous specific details are set forth in the following description in order to provide a thorough understanding of the present invention. However, it will be evident to one of ordinary skill in the art that the present invention may be practiced without some of these specific details.

While this invention is susceptible of embodiment in many different forms, there is shown in the drawings and will herein be described in detailed preferred embodiment of the invention with the understanding that the present disclosure is to be considered as an exemplification of the principles of the invention and is not intended to limit the broad aspect of the invention to the embodiment illustrated.

The numerous innovative teachings of the present application will be described with particular reference to the presently preferred embodiments, wherein these innovative teachings are advantageously applied to the particular problems of a probe needle for measuring low currents with a wide operating temperature range in probing a semiconductor device. However, it should be understood that these embodiments are only examples of the many advantageous uses of the innovative teachings herein. In general, statements made in the specification of the present application do not necessarily limit any of the various claimed inventions. Moreover, some statements may apply to some inventive features but not to others. In general, unless otherwise indicated, singular elements may be in the plural and visa versa with no loss of generality.

The following terms are particularly described throughout the description:

Semiconductor Device not Limitive

The present invention is particularly suitable for probing semiconductor devices, but the use of the present teachings is not limited to probing semiconductor devices. Other devices may be applied to the present invention teachings. Thus, while this specification speaks in terms of probing 'semiconductor' devices, this term should be interpreted broadly to include probing any suitable device.

Low Current not Limitive

The present invention solves the problem of measuring currents below 100 fA, but the current range of the present teachings is not limited to below 100 fA. For example, the present invention may be applied to measure the currents at or above 100 fA in a semiconductor device. Thus, while this specification speaks in terms of 'low currents' or 'measuring currents below 100 fA', these terms should be interpreted broadly to include any current that flows through a semiconductor device which could be at or above 100 fA. In a grounded guard controlled impedance configuration the present invention also solves the problem of measuring high frequency signals at high temperatures.

Wide Temperature not Limitive

The present invention solves the problem of measuring currents of a semiconductor device in a narrow or limited operating temperature range. The present teachings do not limit to a specific operating temperature range. The present application allows a tester to electrically probe semiconductor devices over a wide operating temperature range, not only at a low operating temperature but also a high operating temperature, e.g. an operating temperature up to 300 C and beyond. Thus, while this specification speaks in terms of 'wide temperature range' or 'measuring currents in a wide operating temperature range', these terms should be interpreted broadly to include any suitable operating or testing temperature range of a semiconductor device.

Probe not Limitive

The present invention solves the problem of measuring currents of a semiconductor device using a co-axial or a tri-axial shielded probe. However, nothing in the teachings of the present invention limits application of the teachings of the present invention to a probe needle with more or less layers. Advantageous use of the teachings of the present invention may be had with a probe needle of any number of layers.

Signal Cable not Limitive

The present invention solves the problem of measuring currents of a semiconductor device using a co-axial or a tri-axial signal cable. However, nothing in the teachings of the present invention limits application of the teachings of the present invention to a signal cable with more or less layers. Advantageous use of the teachings of the present invention may be had with a signal cable of any number of layers.

Metals not Limitive

Throughout the discussion herein there will be examples provided that make reference to metals in regards to needle and driven guard. The present invention does not recognize any limitations in regards to what types of metals may be used in affecting the teachings of the present invention. One skilled in the art will recognize that any conductive material may be used with no loss of generality in implementing the teachings of the present invention.

Dielectric not Limitive

Throughout the discussion herein there will be examples provided that make reference to dielectric. The present invention does not recognize any limitations in regards to what types of dielectric may be used in affecting the teachings of the present invention. One skilled in the art will recognize that any non-conductive, highly heat-resistant material may be used with no loss of generality in implementing the teachings of the present invention.

Exemplary Embodiment

As shown in FIG. 1, a shielded probe needle apparatus 100 includes a probe needle 101 covered with a dielectric layer 102, a conductive driven guard layer 103, and an optional protective coating layer 104. The dielectric layer 102 and the optional protective coating layer 104 are preferably applied to the probe needle 101 using a physical/chemical vapor deposition (P/CVD) of high temperature polymer.

Figure 2:
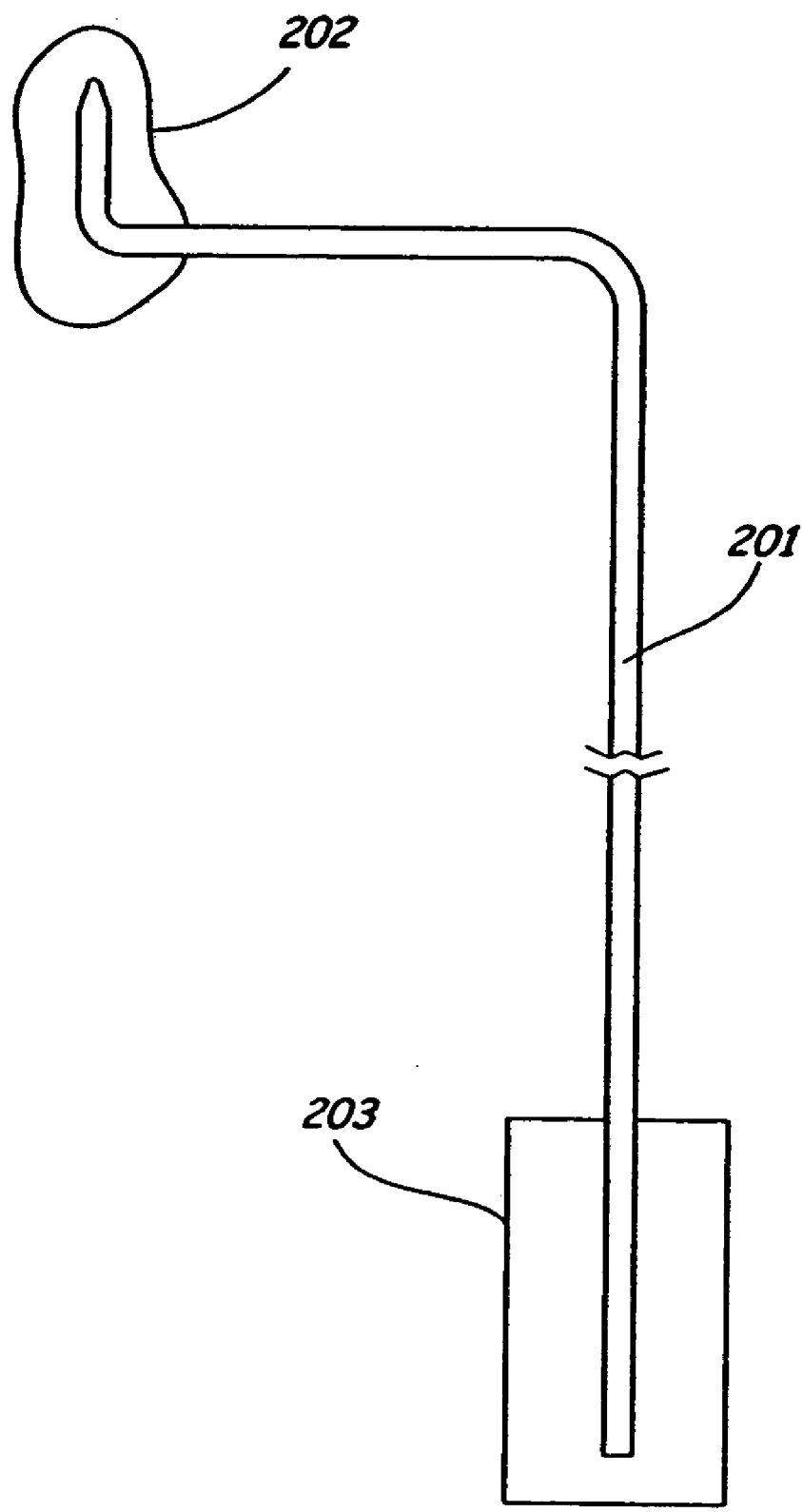
FIG. 2 is a masking technique for masking a shielded probe in accordance with the principles of the present invention.
Figure 5:
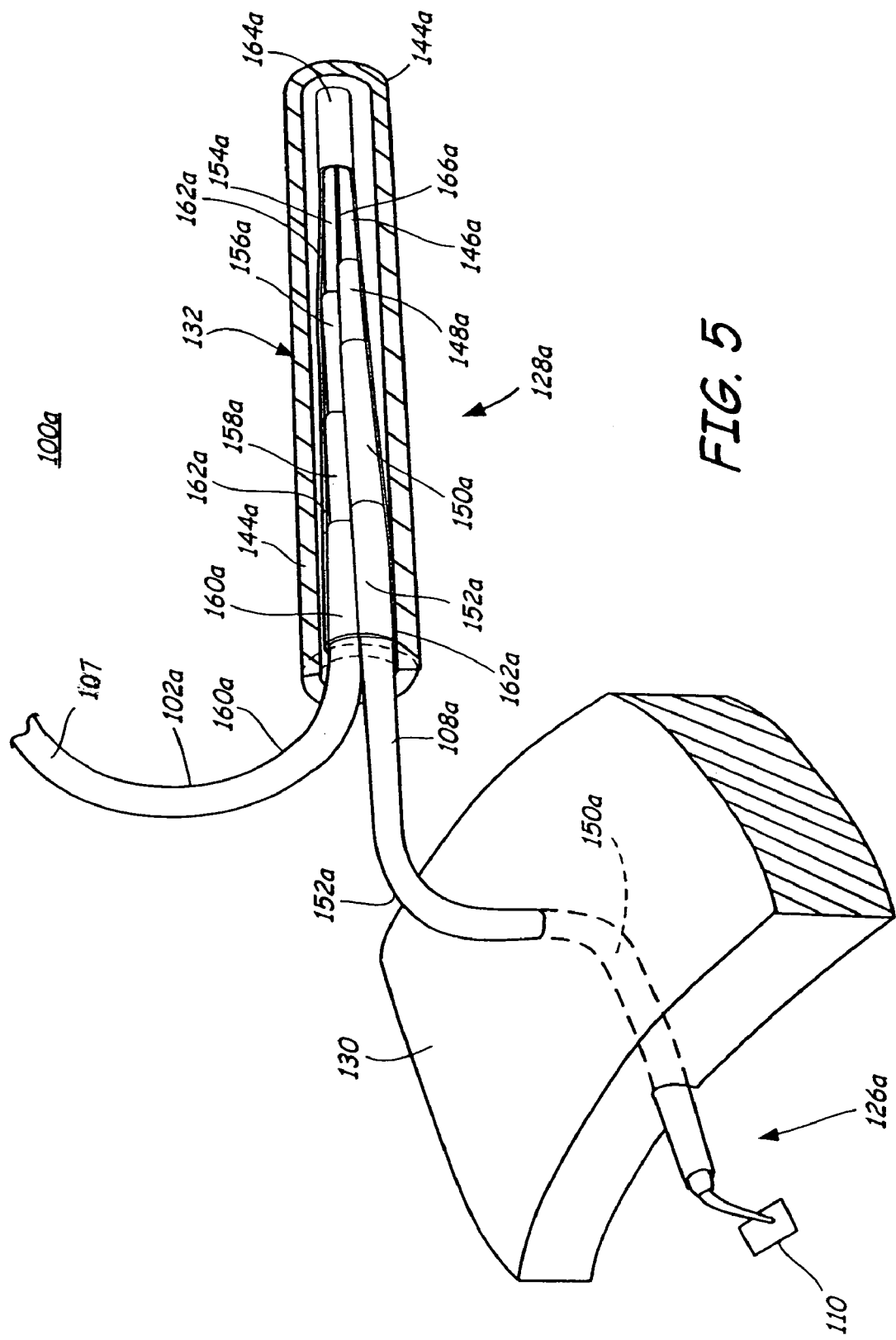
FIG. 5 is a perspective view of one embodiment of a probe apparatus having a co-axial shielded probe terminating with a co-axial signal cable at a terminating device, in accordance with the principles of the present invention.
Figure 6:
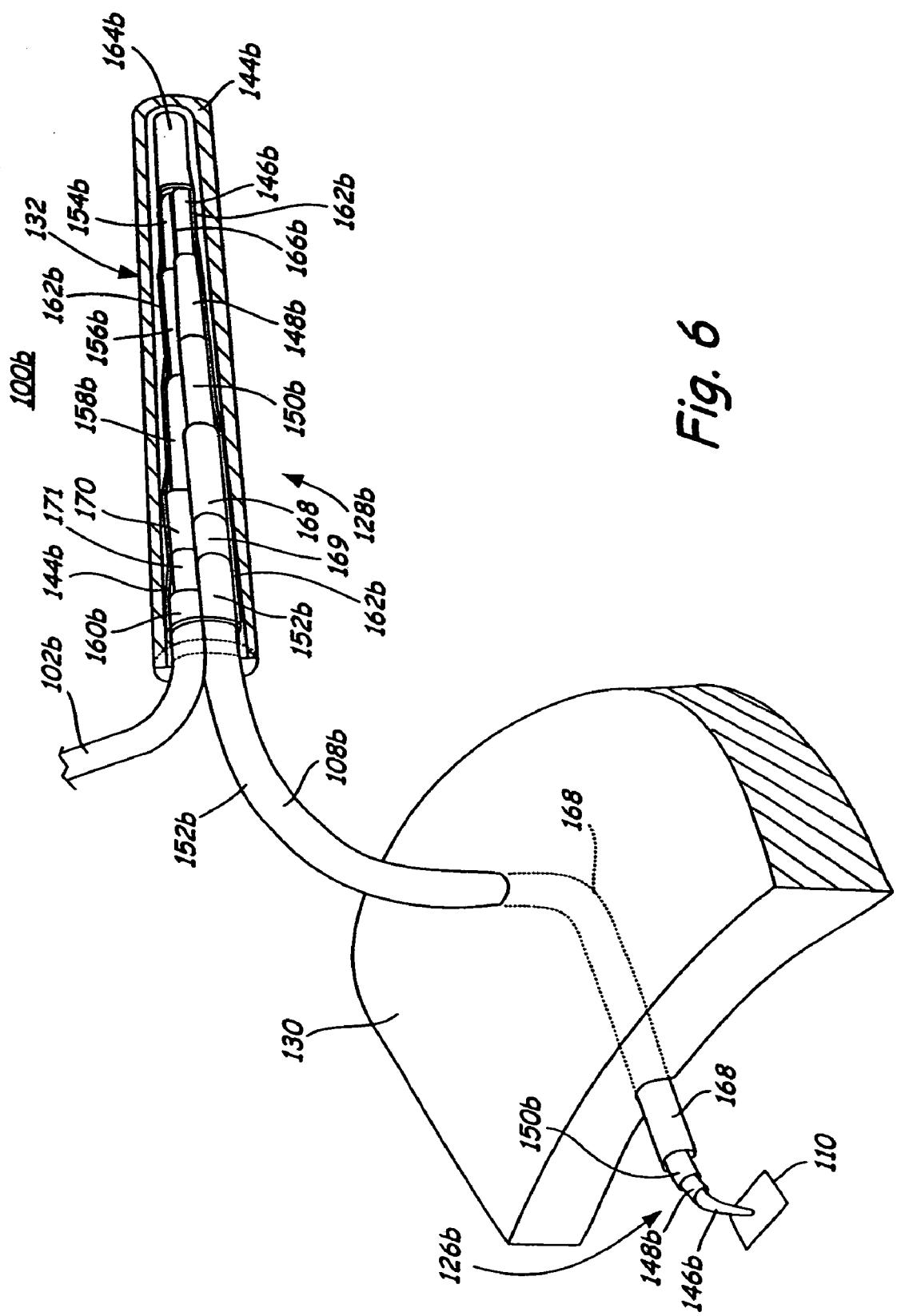
FIG. 6 is a perspective view of one embodiment of a probe apparatus having a tri-axial shielded probe terminating with a tri-axial signal cable at a terminating device, in accordance with the principles of the present invention.

As also shown in FIG. 1, the connection or contact between the probe needle 101 side and the connector or signal cable 107 side is head on head. Alternatively, the connection or contact between the probe needle 101 side and the connector or signal cable 107 side is side by-side as shown in FIGS. 5 and 6, which are disclosed in U.S. Utility patent application Ser. No. 10/383,079, filed Mar. 6, 2003, now U.S. Pat. No. 6,963,207, issued Nov. 8, 2005 subject matter of which are incorporated herewith by reference. FIG. 2 illustrates a masking technique for making a probe needle 201. As shown, making materials 202 and 203 are applied to the ends of the probe needle 201 to prevent the conductive driven guard layer 103, such as the conductive driven guard layer 103 in FIG. 1, from depositing over the end of the dielectric creating a conductive path between the conductive guard layer 103 and the probe needle 201. The masks are applied towards the ends of the probe needle necessary to provide required access and protection.

Alternate methods may be used to achieve at least similar masking functions to prevent electrical contact between the conductive driven guard layer 103 and the probe needle 201, and to provide required access and protection to the probe needle. For example, in one exemplary method, the end of the conductive driven guard layer is removed by ablation or chemical etch to prevent the conductive driven guard layer, such as the conductive driven guard layer 103 in FIG. 1, from remaining on the dielectric creating a conductive path between the conductive guard layer and the probe needle 201. The protective coating 104 is applied over the conductive driven guard layer to provide required access and protection. The mask is then removed or can be left behind as the protective layer.

Figure 3:
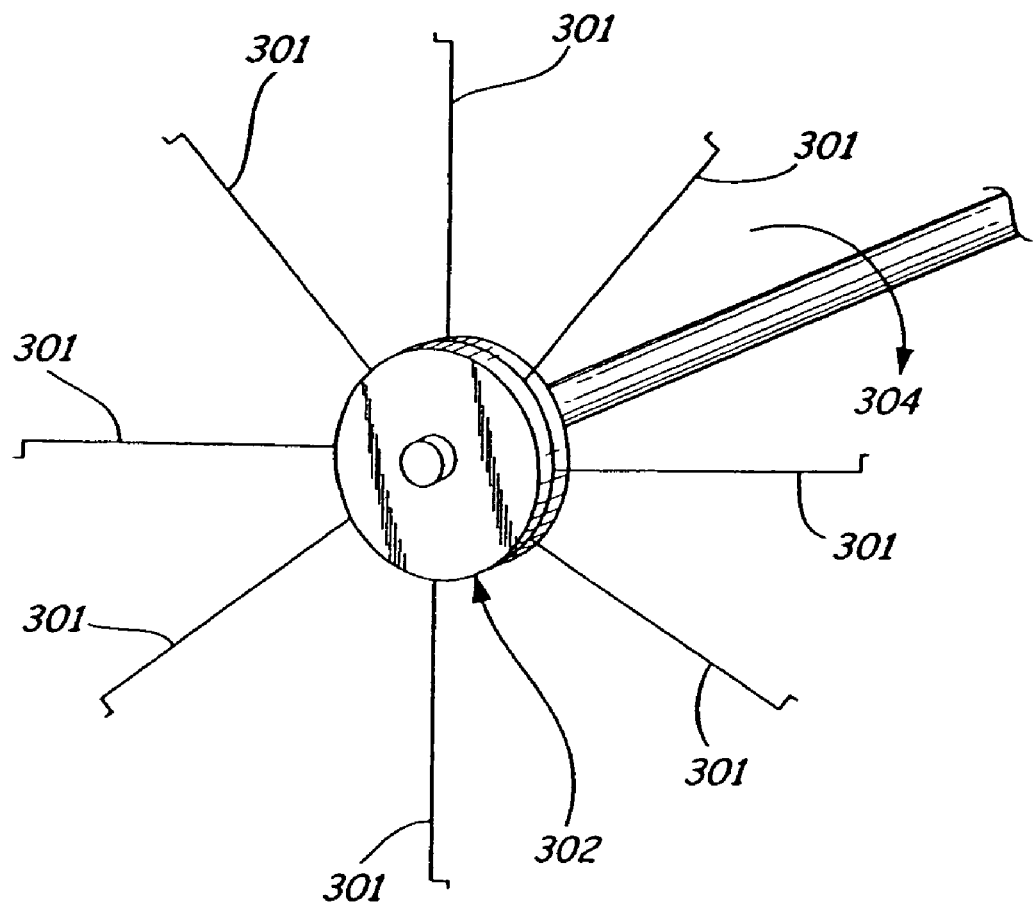
FIG. 3 is a rotational technique for applying one or more conformal coatings on the shielded probe in accordance with the principles of the present invention.

FIG. 3 illustrates a rotational curing technique for coating the shielded probe with dielectric or the conductive guard layer. As shown, a plurality of probe needles 301 are mounted radially on an axially rotational rod 304 by devices, such as clamps 302. A layer is uniformly applied to the probe needles by dipping or spraying and then spinning the probe needles. The masks at the ends of the probe needle also prevent the protective coating layer from touching the probe needle. Alternatively, the masking is not used and the layer is removed by mechanical or chemical means. Uniformly coated materials can be deposited and dried by a flow of thermally conditioned and humidity controlled gas.

Further, in another alternative technique, a mask is applied one end, e.g. a proximal end (the back end) of the probe needle. After a dielectric layer is applied over the probe needle, e.g. a P/CVD layer is deposited over the probe needle, another mask is applied to the other end, e.g. a distal end (the tip end) of the probe needle. Next, a conductive layer, such as gold, is sputtered over the dielectric layer.

Figure 4:
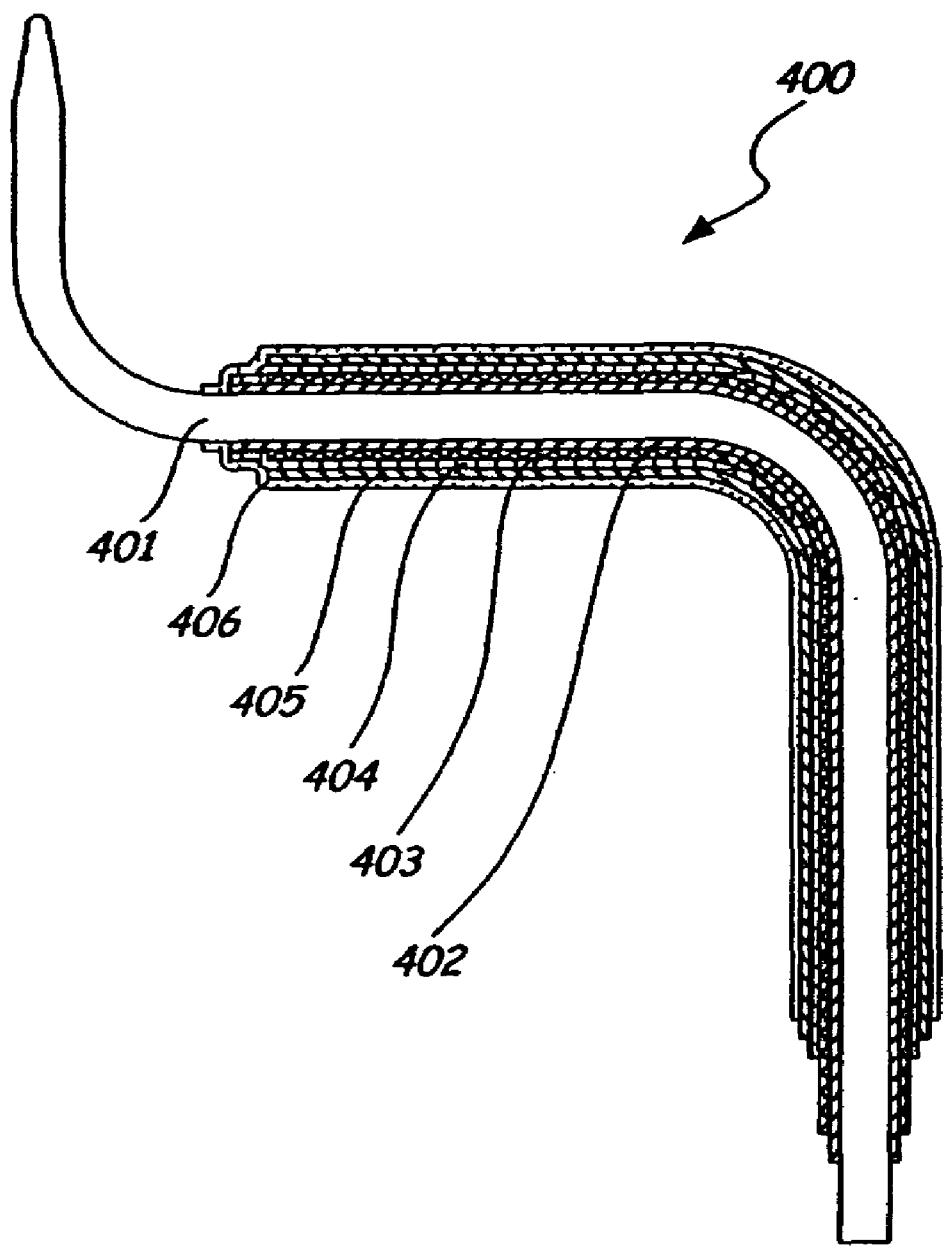
FIG. 4 is a cross sectional view of another embodiment of a shielded probe apparatus in accordance with the principles of the present invention.

FIG. 4 illustrates one embodiment of a probe needle apparatus 400 in a tri-axial configuration. FIG. 1 illustrates one embodiment of the probe needle apparatus 100 in a coaxial configuration. As shown in FIG. 4, the probe apparatus 400 comprises a probe needle 401, a base dielectric layer 402 covering the probe needle 401, a conductive guard layer 403 covering the base dielectric layer 402 which is in turn covered by a second dielectric layer 404, and a second conductive guard layer or an outer guard layer 405 covering the second dielectric layer 404. A nonconductive protective layer 406 may be added for electrical and mechanical protection.

As briefly discussed above, FIG. 5 shows an embodiment of a probe apparatus having a co-axial shielded probe terminating with a co-axial signal cable at a terminating device side by side. The following detailed descriptions have been disclosed in U.S. Utility patent application Ser. No. 10/383,079, filed Mar. 6, 2003, now U.S. Pat. No. 6,963,207, issued Nov. 8, 2005 subject matter of which are incorporated herewith by reference. In FIG. 5, a probe apparatus 100a includes a co-axial shielded probe 108a terminating with a co-axial signal cable 102 at a terminating device 132. The shielded probe 108a includes a center conductive probe needle 146a, a dielectric layer 148a surrounding the center conductive probe needle 146a, a conductive guard layer 150a surrounding the conductive guard layer 150a. The signal cable 102a includes a center signal conductor 154a, a dielectric layer 156a surrounding the dielectric layer 156a, and a non-conductive heat-shrinkable sleeve 160a surrounding the conductive dispersion/guard layer 158a.

At a distal end 126a, the shielded probe 108a extends from the dielectric block 130 toward the bond pad 110. The sleeve 152a is removed when it is inserted into the dielectric block 130.

As shown in FIG. 5, at the proximal end 128a, the center conductive probe needle 146a of the shielded probe 108a is disposed side by side with and electrically connects to the center signal conductor 154a of the signal cable 102a. The dielectric layer 148a of the shielded probe 108a is disposed side by side with and connects to the dielectric layer 156a of the signal cable 102a. The conductive guard layer 150a of the shielded probe 108a is disposed side by side with and electrically connects to the conductive dispersion/guard layer 158a of the signal cable 102a. The sleeve 152a of the shielded probe 108a is disposed side by side with and connects to the sleeve 160a of the signal cable 102a.

As shown in FIG. 5, the terminating device 132 includes a shrink tube 162a for shrink-tubing the sleeve 152a of the shielded probe 108a and the sleeve 160a of the signal cable 102a together, for shrink-tubing the conductive guard layer 150a of the shielded probe 108a and the conductive dispersion/guard layer 158a of the signal cable 102a together, for shrink-tubing the dielectric layer 148a of the shielded probe 108a and the dielectric layer 156a of the signal cable 102a together, and for shrink-tubing the center conductive probe needle 146a of the shielded probe 108a and the center signal conductor 154a of the signal cable 102a together. The shrink tube 162a is covered by the strain relief 144a.

An extension 164a of the shrink tube 162a is disposed at an end of the center conductive probe needle 146a and the center signal conductor 154a, and is configured sufficiently wide enough to prevent electrical current from leaking from the center conductive probe needle 146a and the center signal conductor 154a to the strain relief 144a. In addition, the center conductive probe needle 146a and the center signal conductor 154a may be soldered, brazed, welded, crimped, or snuggled therebetween at 166a to provide additional clearance between the center conductive probe needle 146a and the strain relief 144a, and additional clearance between the center signal conductor 154a and the strain relief 144a.

Similarly, as briefly discussed above, FIG. 6 shows an embodiment of a probe apparatus 100b having a tri-axial shielded probe terminating with a tri-axial signal cable at a terminating device side by side. The following detailed descriptions have been disclosed in U.S. Utility patent application Ser. No. 10/383,079, filed Mar. 6, 2003, now U.S. Pat. No. 6,963,207, issued Nov. 8, 2005 subject matter of which are incorporated herewith by reference. In FIG. 6, the probe apparatus 100b includes a tri-axial shielded probe 108b terminating with a tri-axial signal cable 102b at the terminating device 132. The tri-axial shielded probe 108b additionally includes a second dielectric layer 168 sandwiched between a conductive guard layer 150b and the sleeve 152b. A guard layer 169 may be included between the second dielectric layer 168 and the sleeve 152b. The signal cable 102 additionally includes a second dielectric layer 170 sandwiched between the conductive dispersion/guard layer 158b and the sleeve 160b. A guard layer 171 may be included between the second dielectric layer 171 and the sleeve 160b. Accordingly, as shown in FIG. 6, the shielded probe 108b includes a center conductive probe needle 146b, a dielectric layer 148b surrounding the center conductive probe needle 146b, the conductive guard layer 150b surrounding the dielectric layer 148b, the second dielectric layer 168 surrounding the conductive guard layer 150b, the guard layer 169 surrounding the second dielectric layer 168, and the sleeve 152b surrounding the guard layer 169. The signal cable 102b includes a center signal conductor 154b, a dielectric layer 156b surrounding the center signal conductor 154b, the conductive dispersion/guard layer 158b surrounding the dielectric layer 156b, the second dielectric layer 170 surrounding the conductive dispersion/guard layer 158b, the guard layer 171 surround the second dielectric layer 170, and the sleeve 160b surrounding the guard layer 171.

At a distal end 126*b*, the shielded probe 108*b* extends from the dielectric block 130 toward the bond pad 110. The sleeve 152*b* is removed when it is inserted into the dielectric block 130.

As shown in FIG. 6, at the proximal end 128*b*, the center conductive probe needle 146*b* of the shielded probe 108*b* is disposed side by side with and electrically connects to the center signal conductor 154*b* of the signal cable 102*b*. The dielectric layer 148*b* of the shielded probe 108*b* is disposed side by side with and connects to the dielectric layer 156*b* of the signal cable 102*b*. The conductive guard layer 150*b* of the shielded probe 108*b* is disposed side by side with and electrically connects to the conductive dispersion/guard layer 158*b* of the signal cable 102*b*. The second dielectric layer 168 of the shielded probe 108*b* is disposed side by side with and connects to the second dielectric layer 170 of the signal cable 102*b*. The guard layer 169 of the shielded probe 108*b* is disposed side by side with and electrically connects to the guard layer 171 of the signal cable 102*b*. The sleeve 150*b* of the shielded probe 108*b* is disposed side by side with and connects to the sleeve 160*b* of the signal cable 102*b*.

As shown in FIG. 6, the terminating device 132 includes a shrink tube 162*b* for shrink-tubing the sleeve 152*b* of the shielded probe 108*b* and the sleeve 160*b* of the signal cable 102*b* together, for shrink-tubing the second dielectric layer 168 of the shielded probe 108*b* and the second dielectric layer 170 of the signal cable 102*b* together, for shrink-tubing the conductive guard layer 150*b* of the shielded probe 108*b* and the conductive dispersion/guard layer 158*b* of the signal cable 102*b* together, for shrink-tubing the guard layer 169 of the shielded probe and the guard layer 171 of the signal cable 102*b*, for shrink-tubing the dielectric layer 148*b* of the shielded probe 108*b* and the dielectric layer 156*b* of the signal cable 102*b* together, and for shrink-tubing the center conductive probe needle 146*b* of the shielded probe 108*b* and the center signal conductor 154*b* of the signal cable 102*b* together. The shrink tube 162*b* is covered by the strain relief 144*b*.

An extension 164*b* of the shrink tube 162*b* is disposed at an end of the center conductive probe needle 146*b* and the center signal conductor 154*b*, and is configured sufficiently wide enough to prevent electrical current from leaking from the center conductive probe needle 146*b* and the center signal conductor 154*b* to the strain relief 144*b*. In addition, the center conductive probe needle 146*b* and the center signal conductor 154*b* may be soldered, brazed, welded, crimped, or snuggled therebetween at 166*b* to provide additional clearance between the center conductive probe needle 146*a* and the strain relief 144*b*, and additional clearance between the center signal conductor 154*a* and the strain relief 144*b*.

From the above description and drawings, it will be understood by those of ordinary skill in the art that the particular embodiments shown and described are for purposes of illustration only and are not intended to limit the scope of the present invention. Those of ordinary skill in the art will recognize that the present invention may be embodied in other specific forms without departing from its spirit or essential characteristics. References to details of particular embodiments are not intended to limit the scope of the invention.

What is claimed is:

1. A probe needle apparatus comprising:
a conductive central core;
a first layer of dielectric material applied to maintain electrical access to the conductive central core while providing continuous isolation of the conductive central core elsewhere;
a conductive driven guard layer applied on and disposed around the first layer of dielectric material in electrical isolation from the conductive central core;
a protective non-conductive layer applied on and disposed around the conductive driven guard layer to provide electrical and mechanical protection, wherein the protective non-conductive layer is applied on the conductive driven guard layer by spinning the conductive central core; and
a mask applied on and disposed around an end of the conductive central core to prevent the conductive driven guard layer from touching the conductive central core.

2. The apparatus of claim 1, wherein the first layer of dielectric material is coated by using a physical/chemical vapor deposition (P/CVD) of high temperature polymer.

3. A probe needle apparatus comprising:
a conductive central core;
a first layer of dielectric material applied to maintain electrical access to the conductive central core while providing continuous isolation of the conductive central core elsewhere;
a conductive driven guard layer applied on and disposed around the first layer of dielectric material and removed on an end by mechanical or chemical means to prevent the conductive driven guard layer from touching the conductive central core; and
a protective non-conductive layer applied on and disposed around the conductive driven guard layer to provide electrical and mechanical protection, wherein the protective non-conductive layer is applied on the conductive driven guard layer by spinning the conductive central core.

4. A probe needle apparatus comprising:
a conductive central core;
a first layer of dielectric material applied to maintain electrical access to the conductive central core while providing continuous isolation of the conductive central core elsewhere;
a conductive driven guard layer applied on and disposed around the first layer of dielectric material in electrical isolation from the conductive central core;
a second layer of dielectric material applied to maintain electrical access to the conductive central core and the first layer of dielectric material while providing continuous isolation of the conductive central core and the conductive driven guard layer elsewhere;
a second guard layer applied on and disposed around the second layer of dielectric material;
a protective non-conductive layer applied on and disposed around the second guard layer to provide electrical and mechanical protection, wherein the protective non-conductive layer is applied on the second guard layer by spinning the conductive central core; and
a mask applied on and disposed around an end of the conductive central core to prevent the conductive driven guard layer from touching the conductive central core.

* * * * *